United States Patent
Liu et al.

(10) Patent No.: US 8,511,956 B2
(45) Date of Patent: Aug. 20, 2013

(54) FASTENER AND HEAT DISSIPATION DEVICE USING THE SAME

(75) Inventors: Jian Liu, Shenzhen (CN); Jing Zhang, Shenzhen (CN)

(73) Assignees: Fu Zhun Precision Industry (Shen Zhen) Co., Ltd., Shenzhen (CN); Fox Technology Co., Ltd., New Taipei (TW)

( * ) Notice: Subject to any disclaimer, the term of this patent is extended or adjusted under 35 U.S.C. 154(b) by 864 days.

(21) Appl. No.: 12/688,796

(22) Filed: Jan. 15, 2010

(65) Prior Publication Data

US 2011/0100595 A1 May 5, 2011

(30) Foreign Application Priority Data

Oct. 30, 2009 (CN) .......................... 2009 1 0309077

(51) Int. Cl.
 *F16B 39/00* (2006.01)
(52) U.S. Cl.
 USPC ............................. 411/353; 411/999; 411/107
(58) Field of Classification Search
 USPC .......................................... 411/107, 353, 999
 See application file for complete search history.

(56) References Cited

U.S. PATENT DOCUMENTS

| 2,831,520 | A | * | 4/1958 | Clarke | 411/349 |
|---|---|---|---|---|---|
| 3,343,581 | A | * | 9/1967 | Martin et al. | 411/349 |
| 3,465,803 | A | * | 9/1969 | Swanstrom et al. | 411/349 |
| 4,915,557 | A | * | 4/1990 | Stafford | 411/107 |
| 4,952,107 | A | * | 8/1990 | Dupree | 411/103 |
| 5,338,139 | A | * | 8/1994 | Swanstrom | 411/353 |
| 5,382,124 | A | * | 1/1995 | Frattarola | 411/352 |
| 5,611,654 | A | * | 3/1997 | Frattarola et al. | 411/432 |
| 5,807,052 | A | * | 9/1998 | Van Boven et al. | 411/353 |
| 6,176,665 | B1 | * | 1/2001 | Bondarowicz et al. | 411/424 |
| 6,394,724 | B1 | * | 5/2002 | Kelly et al. | 411/353 |
| 8,074,705 | B2 | | 12/2011 | Lu | |
| 2003/0175091 | A1 | * | 9/2003 | Aukzemas et al. | 411/107 |
| 2007/0217159 | A1 | | 9/2007 | Long et al. | |

FOREIGN PATENT DOCUMENTS

| CN | 101039564 A | 9/2007 |
|---|---|---|
| CN | 101568246 A | 10/2009 |

* cited by examiner

*Primary Examiner* — Flemming Saether
(74) *Attorney, Agent, or Firm* — Altis Law Group, Inc.

(57) ABSTRACT

An exemplary fastener used for connecting at least two components together includes a bolt, a shell, and an elastic member. The bolt has a head, a shaft, an engaging portion, and a threaded portion in series. A diameter of the engaging portion is larger than a diameter of the shaft and a diameter of the threaded portion. The shell has a side wall and a collar extending inwardly from a bottom of the side wall. The collar defines a through hole therein. A diameter of the through hole is slightly smaller than the diameter of the engaging portion of the bolt. The elastic member is sandwiched between the head of the bolt and the collar of the shell. The bolt with the elastic member is received in the shell, and a top of the engaging portion of the bolt abuts against a bottom of the collar of the shell.

12 Claims, 4 Drawing Sheets

FASTENER AND HEAT DISSIPATION DEVICE USING THE SAME

BACKGROUND

1. Technical Field

The present disclosure generally relates to fasteners, and more particularly to a fastener with an elastic member always kept on a shaft of a bolt. The present disclosure is also related to a heat dissipation device using the fastener.

2. Description of Related Art

It is well known that a fastener is used for connecting two or more components together.

Referring to FIG. 1, a conventional fastener includes a bolt having a head 10 and a shaft 12 extending integrally from the head 10, and a spring 13 coiled around the shaft 12. The head 10 defines a groove 14 in a top end thereof for facilitating operation of a tool thereon. During use of the fastener, the shaft 12 extends through a through hole 152 defined in a first component 15 and aligns with a threaded hole 162 defined in a second component 16. Then a tip of a screwdriver is brought to fit into the groove 14 and exert a downwardly pushing and rotating force on the head 10, thereby pushing downwardly and turning the fastener at the same time. Thus the shaft 12 of the fastener is threadedly engaged into the threaded hole 162 of the second component 16. The spring 13 is sandwiched between the head 10 and the first component 15, whereby the first component 15 and the second component 16 are securely connected together.

However, the spring 13 and the shaft 12 are always separated as two independent components before the fastener is used. When the fastener is needed to fasten the two components 15, 16 together, the spring 13 and the shaft 12 are brought together, and the spring 13 is placed around the shaft 12. Then the shaft 12 is extended through the first component 15 and engaged with the second component 16. It is time-consuming and laborious to prepare to use the fastener, and therefore it is inconvenient to assemble the first and second components 15, 16 together by using the fastener. Even worse, the spring 13 is easily lost if the fastener is not handled carefully. This can occur when the fastener is loosened from the two components 15, 16 to disassemble the two components 15, 16 for a required repair or maintenance.

What is needed, therefore, is a fastener having a bolt and a spring assembled together as a single unit so that the fastener can always be ready for use.

DETAILED DESCRIPTION

Figure 1:
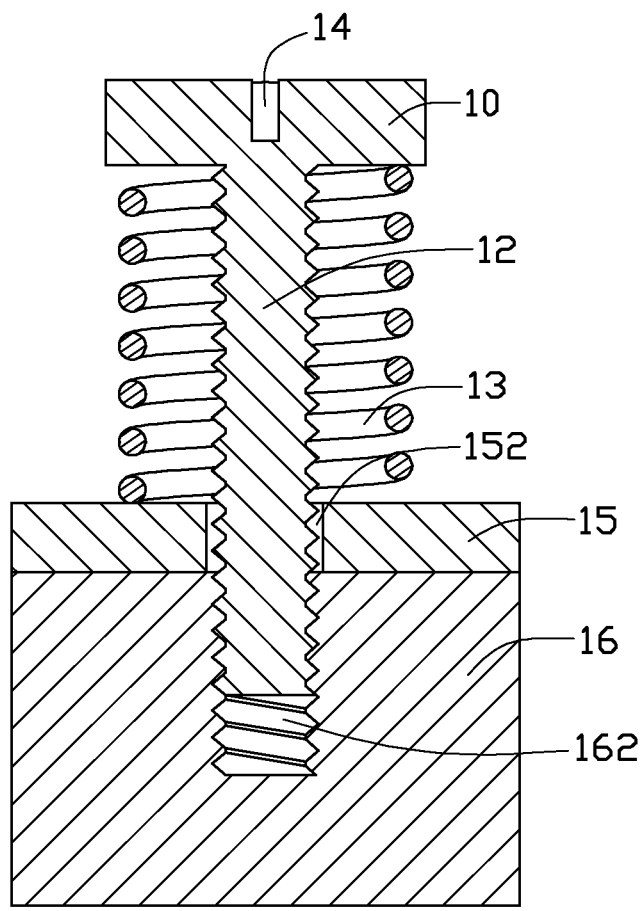
FIG. 1 is a sectional view showing a fastener in accordance with the related art, showing the fastener fastening two components together.
Figure 2:
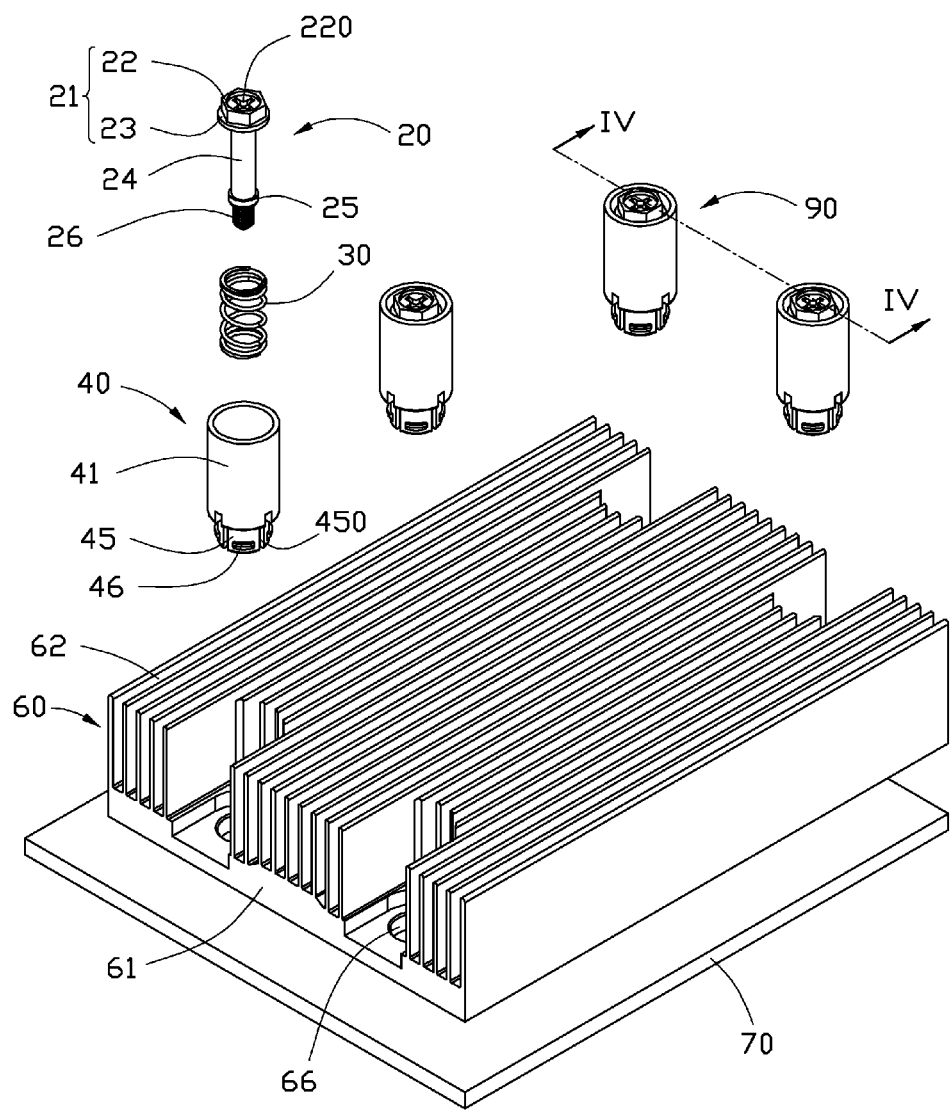
FIG. 2 is an exploded view of a heat dissipation device which employs four fasteners in accordance with a preferred embodiment of the present disclosure.
Figure 3:
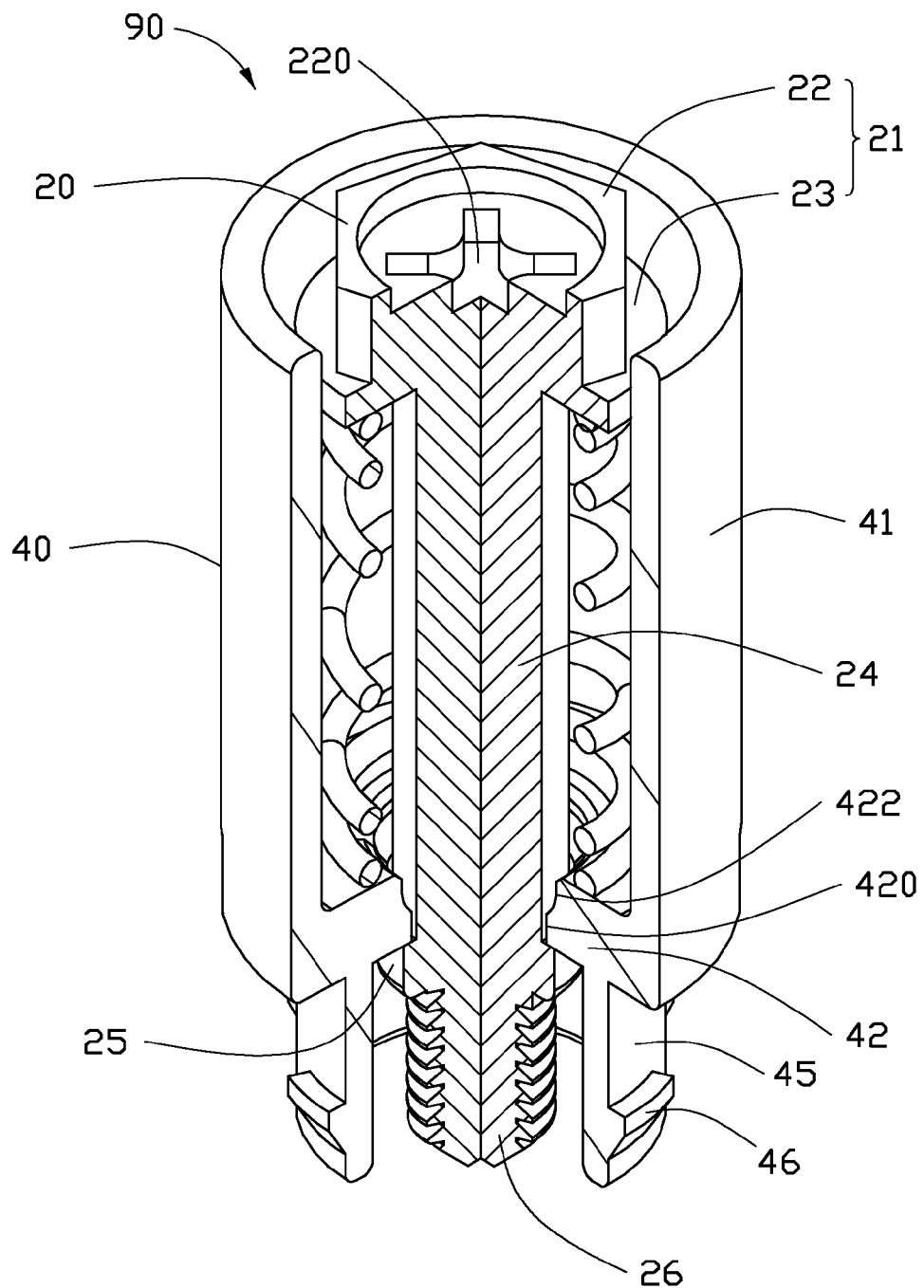
FIG. 3 is an enlarged, cutaway view of one of the fasteners of FIG. 2.

Referring to FIGS. 2-3, a heat dissipation device in accordance with an embodiment of the disclosure comprises a heat sink 60 and four fasteners 90. The fasteners 90 are used to mount a heat sink 60 on a component 70 such as a printed circuit board. Each of the fasteners 90 comprises a bolt 20, an elastic member 30 coiled around the bolt 20, and a shell 40 receiving the bolt 20 and the elastic member 30 therein. In this embodiment, the elastic member 30 is a helical spring. The heat sink 60 comprises a base 61, and a plurality of fins 62 extending integrally from a top of the base 61. The base 61 defines four mounting holes 66 for extension of the fasteners 90 therethrough.

The bolt 20 comprises a head 21, a shaft 24, an engaging portion 25, and a threaded portion 26 in series. The head 21 includes an operating portion 22, and a resisting portion 23 extending horizontally and outwardly from a bottom of the operating portion 22. The operating portion 22 defines a cross-shaped groove 220 in a top end thereof, for facilitating operation of a tool such as a screwdriver thereon. The engaging portion 25 extends from a bottom of the shaft 24. A diameter of the engaging portion 25 is larger than a diameter of the shaft 24, and larger than a diameter of the threaded portion 26. The engaging portion 25 has an chamfer at a bottom edge thereof. The threaded portion 26 is substantially a hollow cylinder, and has a spiral thread formed on an inner wall thereof.

The shell 40 comprises a cylindrical side wall 41, a collar 42 extending perpendicularly and inwardly from a bottom end of the side wall 41, and an elongated projection 45 extending down from a bottom of the collar 42. An inner diameter of the side wall 41 is larger than a diameter of the resisting portion 23, and larger than an outer diameter of the elastic member 30. The collar 42 defines a through hole 420 therein. A diameter of the through hole 420 is larger than that of the shaft 24, and slightly smaller than that of the engaging portion 25 of the bolt 20. The collar 42 defines an annular guiding groove 422 at an inner periphery of a top thereof, corresponding to the chamfer of the engaging portion 25. A diameter of the guiding groove 422 gradually decreases from top to bottom, thereby facilitating extension of the engaging portion 25 through the collar 42. The projection 45 defines a central hole (not labeled), which has a diameter larger than the diameter of the through hole 420 of the collar 42. An outer diameter of the projection 45 is smaller than an outer diameter of the side wall 41. Four vertical and axial splits 450 are defined in a bottom end of the shell 40. The axial splits 450 are equally angularly spaced from each other around a central axis (not labeled) of the shell 40. Each split 450 spans through both the projection 45 and the collar 42. Thus, the splits 450 divide the projection 45 and the collar 42 into four parts, to provide the projection 45 and the collar 42 with elasticity in radial directions. The projection 45 has four blocks 46 extending radially outwardly from a bottom end thereof. Each of the blocks 46 is located between two corresponding splits 450.

Figure 4:
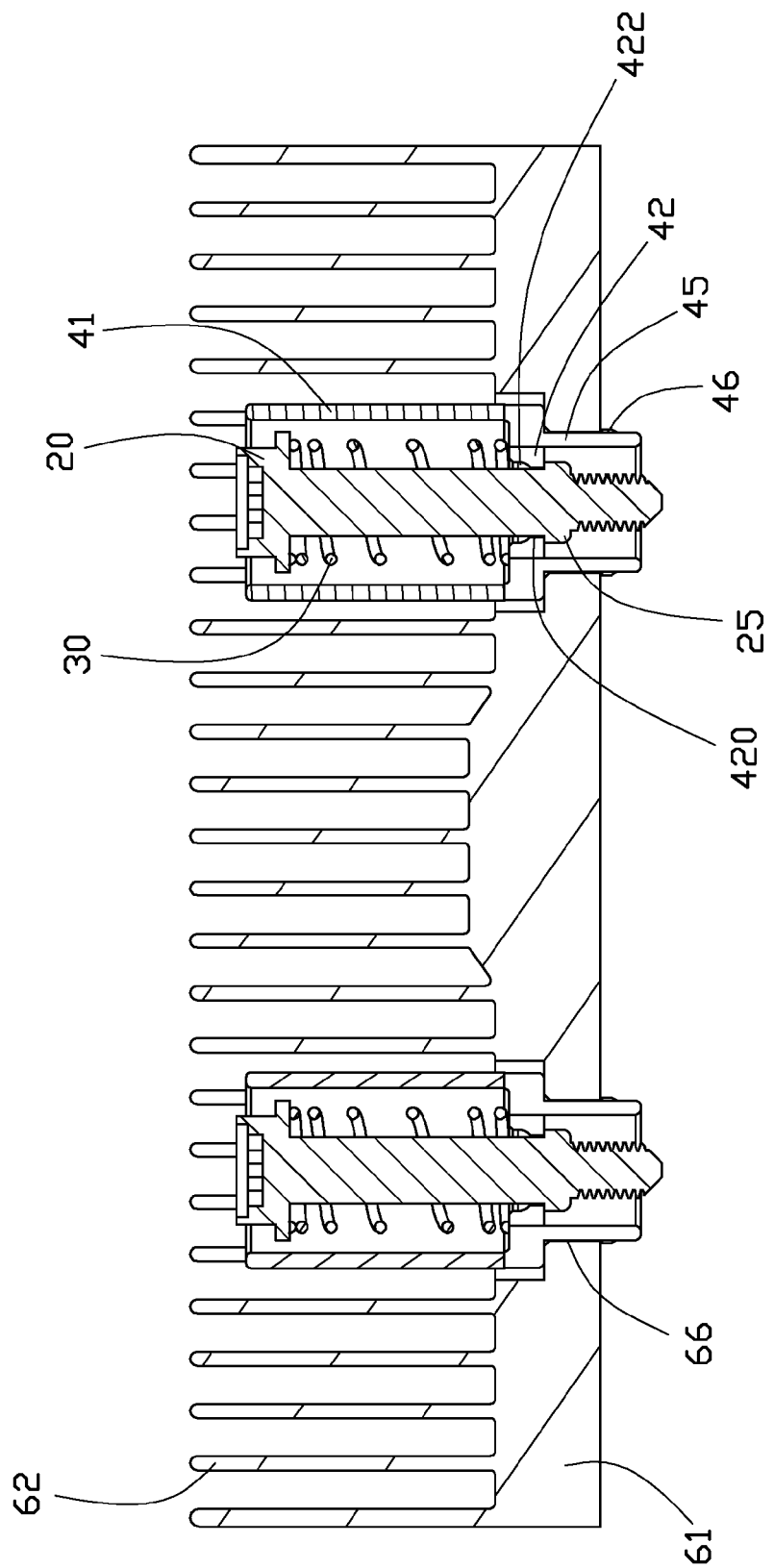
FIG. 4 is an enlarged, sectional view of the heat dissipation device of FIG. 2 after the heat dissipation device has been assembled.

Referring also to FIG. 4, in assembly of each fastener 90, the bolt 20 with the shaft 24 surrounded by the elastic member 30 is inserted into the inside of the shell 40 through the top of the shell 40, wherein the engaging portion 25 of the bolt 20 is forced to interferentially extend through the through hole 420 of the collar 42. In detail, the engaging portion 25 with the chamfer slides along the guiding groove 422 into the through hole 420 and expands the collar 42 radially outwardly. After the engaging portion 25 has passed through the collar 42, the collar 42 elastically rebounds to closely surround the shaft 24. A top annular rim of the engaging portion 25 tightly abuts against a bottom of the collar 42, thereby limiting axial movement of the engaging portion 25 relative to the shell 40. The elastic member 30 is sandwiched between the resisting portion 23 of the head 21 and the collar 42 of the shell 40, and is fully received in the shell 40. In the present embodiment, the elastic member 30 is in a slightly compressed state between the resisting portion 23 and the collar 42. Thus, the shell 40, the bolt 20 and the elastic member 30 are assembled together.

In use of the fasteners 90 to mount the heat sink 60, the fasteners 90 are inserted into the through holes 66 of the heat sink 60. For each fastener 90, the projection 45 of the shell 40 is compressed by the wall of the heat sink 60 surrounding the corresponding through hole 66. Thereby, the projection 45 is deformably passed through the through hole 66, and thereupon snappingly engaged with the heat sink 60. Top arc-shaped rims of the blocks 46 of the projection 45 abut against a bottom of the heat sink 60. Thereby, the fasteners 90 are pre-assembled onto the heat sink 60. When the heat dissipation device is mounted onto the component 70, a screwdriver is used. A tip of the screwdriver fits in the cross-shaped groove 220, and the screwdriver exerts a downward pressing and turning force on the bolt 20 to fasten the heat sink 60 and the component 70 together.

In summary, the engaging portion 25 of the bolt 20 engages with the collar 42 of the shell 40, whereby the shell 40 encloses the bolt 20 and the elastic member 30 therein. Thus, the fastener is pre-assembled as a single unit ready for use. In use of the fastener, the elastic member 30 remains around the shaft 24 in the shell 40 before and during the process of the fastener 90 being engaged with the heat sink 60. This can save on labor and save on time. Subsequently, the fastener 90 can connect the heat sink 60 and the component 70 together readily and conveniently.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

The invention claimed is:

1. A fastener used for fastening at least two components together, the fastener comprising:
    a bolt comprising a head, a shaft extending down from the head, an engaging portion extending from the shaft, and a threaded portion extending down from the engaging portion, a diameter of the engaging portion being larger than a diameter of the shaft and larger than a diameter of the threaded portion;
    a shell comprising a cylindrical side wall and a collar extending inwardly from a bottom of the side wall, the collar defining a through hole therein, a diameter of the through hole being slightly smaller than the diameter of the engaging portion of the bolt;
    a projection extending down from the collar and receiving the engaging portion of the bolt therein, a plurality of axial splits being defined in the projection and spanning through both the projection and the collar; and
    an elastic member placed around the shaft and sandwiched between the head of the bolt and the collar of the shell;
    wherein the bolt with the elastic member is received in the shell, with a top rim of the engaging portion of the bolt abutting against a bottom of the collar of the shell, and the engaging portion is forced to extend through the through hole of the collar with expanding the collar radially and outwardly.

2. The fastener of claim 1, wherein the projection defines a central hole having a diameter larger than the diameter of the through hole of the collar.

3. The fastener of claim 1, wherein the projection has a plurality of blocks extending outwardly from a lower end thereof, each of the blocks being located between two corresponding splits.

4. The fastener of claim 1, wherein the engaging portion has a chamfer at a bottom end thereof.

5. The fastener of claim 4, wherein the collar defines an annular guiding groove at an inner periphery of a top thereof, corresponding to the chamfer of the engaging portion.

6. A heat dissipation device comprising a heat sink and a fastener engaged with the heat sink for mounting the heat sink onto a component, the fastener comprising:
    a bolt comprising a head, a shaft extending down from the head, an engaging portion extending from the shaft, and a threaded portion down extending from the engaging portion, a diameter of the engaging portion being larger than a diameter of the shaft and larger than a diameter of the threaded portion;
    a shell comprising a cylindrical side wall, a collar extending inwardly from a bottom of the side wall, and a projection extending down from the collar and engaged in the heat sink, the collar defining a through hole therein, a diameter of the through hole being slightly smaller than the diameter of the engaging portion of the bolt, a plurality of axial splits being defined in the projection and spanning through both the projection and the collar; and
    an elastic member positioned around the shaft and sandwiched between the head of the bolt and the collar of the shell;
    wherein the bolt with the elastic member is received in the shell, with a top rim of the engaging portion of the bolt abutting against a bottom of the collar of the shell, and the engaging portion is forced to extend through the through hole of the collar with expanding the collar radially and outwardly.

7. The heat dissipation device of claim 6, wherein the projection defines a central hole having a diameter larger than the diameter of the through hole of the collar.

8. The heat dissipation device of claim 6, wherein the projection has a plurality of blocks extending outwardly from a lower end thereof, each of the blocks being located between two corresponding splits.

9. The heat dissipation device of claim 8, wherein the projection is snappingly engaged with the heat sink, top arc-shaped rims of the blocks of the projection abutting against a bottom of the heat sink.

10. The heat dissipation device of claim 6, wherein the engaging portion has a chamfer at a bottom end thereof.

11. The heat dissipation device of claim 10, wherein the collar defines an annular guiding groove at an inner periphery of a top thereof, corresponding to the chamfer of the engaging portion.

12. A fastener for fastening at least two components together, the fastener comprising:
    a bolt comprising a head, a shaft extending down from the head, an engaging portion extending from the shaft, and a threaded portion down extending from the engaging portion, a diameter of the engaging portion being larger than a diameter of the shaft and larger than a diameter of the threaded portion;
    a shell comprising a cylindrical side wall and a collar extending inwardly from a bottom of the side wall, the collar being elastically deformable and defining a through hole therein, a diameter of the through hole being slightly smaller than the diameter of the engaging portion of the bolt;

a projection extending down from the collar and receiving the engaging portion of the bolt therein, a plurality of axial splits being defined in the projection and spanning through both the projection and the collar; and an elastic member positioned around the shaft;

wherein when the bolt with the elastic member is received in the shell, the engaging portion is interferentially passed through the through hole with the collar elastically deforming with expanding the collar radially and outwardly; and when the engaging portion has passed through the through hole, the collar rebounds, a top rim of the engaging portion abuts against a bottom of the collar, and the elastic member is sandwiched between the head and a top of the collar.

* * * * *